United States Patent [19]

Viola

[11] Patent Number: 4,949,051

[45] Date of Patent: Aug. 14, 1990

[54] PHASE LOCK CLOCK RECOVERY WITH AIDED FREQUENCY AQUISITION

[75] Inventor: Jeffrey P. Viola, Brookhaven, Pa.

[73] Assignee: General Electric Company, Camden, N.J.

[21] Appl. No.: 401,707

[22] Filed: Sep. 1, 1989

[51] Int. Cl.⁵ .............................................. H03L 7/00
[52] U.S. Cl. .......................................... 331/11; 331/34
[58] Field of Search ..................... 331/1 A, 10, 11, 14, 331/16, 17, 25, 34; 375/81, 82, 120; 455/260

[56] References Cited

U.S. PATENT DOCUMENTS

| | | | |
|---|---|---|---|
| 3,697,690 | 10/1972 | Aaron et al. | 178/69.5 R |
| 4,100,503 | 7/1978 | Lindsey et al. | 331/1 A |
| 4,101,844 | 7/1978 | Malone | 331/10 |
| 4,243,941 | 1/1981 | Zdunek | 329/50 |
| 4,556,866 | 12/1985 | Gorecki | 340/310 A |
| 4,787,097 | 11/1988 | Rizzo | 331/11 X |

FOREIGN PATENT DOCUMENTS 0060052  5/1977  Japan ..................................... 331/11

OTHER PUBLICATIONS

"Architecture and Design of a Reliable Token-Ring Network," *IEEE J. on Selected Areas in Communications*, Nov. 1983, pp. 756–765, by Werner Bux et al.

*Primary Examiner*—Robert J. Pascal
*Attorney, Agent, or Firm*—Raymond E. Smiley

[57] ABSTRACT

In a burst mode fiber-optic transmitter-receiver or bus interface unit (BIU), the clock recovery process by a phase lock loop (PLL), or more generally a servo loop, detects the frequency difference between the PLL oscillator and the transmitter oscillator, and generates a control voltage which is combined with the voltage controlled oscillator (VCO) error voltage to urge the PLL oscillator towards the transmitter's frequency. An activity detector detects the presence of received signal, and "freezes" or holds the control voltage to the PLL so the PLL is free to slew to the frequency and phase of the clock of the received burst. Thus, the PLL is maintained near the expected frequency of the received clock signal for fast acquisition. After the burst, the activity detector once again allows the frequency control signal to assert command of the VCO frequency.

11 Claims, 3 Drawing Sheets

PHASE LOCK CLOCK RECOVERY WITH AIDED FREQUENCY AQUISITION

BACKGROUND OF INVENTION

1. Field of Invention

This invention is concerned with a circuit for recovering a clock signal from an input data stream signal and, more particularly, with such a circuit using a dual servo or, more particularly, a dual phase lock loop to more quickly lock onto the frequency of the input data stream signal.

2. Description of the Prior Art

In systems involving the transmission of digital data including an embedded clock signal, digital communication links and networks utilize various schemes for receiver clock recovery from the encoded digital data stream. A particular technique is selected and optimized to fulfill system requirements. Phase lock loops (digital, analog, and hybrid) in various configurations, high Q bandpass filter techniques and various digital edge referenced retiming schemes are typical candidates. Constraints such as system configuration, operating mode (burst or continuous), data rate, channel bandwidth, message overhead, transceiver coupling, etc., must be taken into account when selecting a clock recovery technique.

An exemplary (but not limiting) example of a burst mode communication system is shown in FIG. 1, to be discussed in more detail hereinafter. This is a fiber optic based, star coupled local area network (FOLAN) configuration. The outputs of all fiber optic transmitters are mixed in the star coupler and sent to each fiber optic receiver. This forms an "optical bus". The bus interface unit (BIU) performs the "connectivity function" from each user(s) at a location to the local area network. This particular configuration provides versatile and efficient user interconnect environment.

In FIG. 2, also to be discussed in detail hereinafter, the internal functional details of the BIU are shown. Bus transmission and reception circuits are delineated in particular. The modulator circuit takes the user data stream and digitally encodes it in preparation for transmission. This circuit typically uses a stable, accurate frequency source, such as a crystal oscillator, for baseband modulation. One (of several) reason this encoding is performed is to "embed" clocking information in the transmitted data stream for use at each BIU receiver.

The receive portion of a BIU performs clock recovery (or extraction) from the incoming data stream and sends this clocking information to the demodulator circuit in order to decode the data. This stream is sent to the remaining BIU circuits and eventually to the appropriate user(s).

One of the major problems associated with the above-described FOLAN system is the necessity to "gate" or burst the outgoing messages from each BIU to prevent message collisions at the receivers. Circuits for recovering clock, therefore, must respond to, or stabilize rapidly upon receipt of, the message burst in order to maintain an efficient system.

The decision to use a particular clock recovery scheme is based upon many factors, but one of the major ones is the choice of allowable data encoding schemes. The transmission medium bandwidth is a premium resource (especially in >100 megabit/second systems) and thus an encoding scheme that has the best (highest) unencoded bandwidth/encoded bandwidth (efficiency) ratio (to a maximum of 1.0) is desired. A phase-lock clock recovery method is typically superior to other methods when it is desired or necessary to maintain a ratio of approximately $\geq 0.7$.

Locking a local receiver oscillator to the incoming data stream is a typical way of recovering clock in communication systems, to be discussed in detail hereinafter. FIG. 3 shows a typical prior art receiver using a phase lock loop (PLL) scheme for clock recovery. Incoming data is modified (typically by a signal differention block, d/dt as shown) to enhance the spectral output at the clock frequency, and sent to the phase lock loop circuit which locks to the received bit stream. Such a phase lock loop circuit outputs both the data reclocked with the clock information and the recovered clock signal.

Although many various schemes for phase lock loop circuits have been designed for clock recovery (similar to the one just described), designing burst-mode responsive PLL's is considerably more difficult. Minimization of the locking or acquisition process can be accomplished with such PLL circuit enhancements as loop bandwidth widening, voltage controlled oscillator (VCO) frequency sweeping, etc. In all of these design enhancements, frequency and phase acquisition occur consecutively. Frequency acquisition is typically more difficult and takes longer. Thus, all of these schemes (in general) seek to reduce the frequency acquisition portion of the lock process, and once this is achieved, phase acquisition will (or should) occur rapidly.

In the loop bandwidth widening method, acquisition is sped up by "opening up" the loop bandwidth with a circuit that detects a loss of lock (or out of lock) condition. Wider initial loop bandwidth enhances the frequency acquisition ability of the PLL and once lock is detected, the bandwidth is restricted to enhance noise performance, etc. Typical circuits electrically switch in and out components in the loop filter feedback network. This technique requires at least two auxiliary circuits (the lock detect and the loop switch logic) and is thus rather cumbersome. The high frequency degradation and transient noise induction due to the switch circuitry in the loop filter is also of considerable concern.

The frequency sweep method uses an auxiliary circuit to sweep the VCO center frequency (unlocked) in search of the input's clock frequency. The circuit stops sweeping when lock detect occurs. Since the input frequency relative to the sweeping VCO frequency, at the instant of input burst reception, is unknown and thus a random process, improvement in frequency acquisition time is only an average over all time. Also, the rate of sweep has an upper bound, limited by the response time of the loop elements. The overall phase lock loop circuit using this technique has similar complexity problems of the previous method, i.e., the loop bandwidth widening method.

A phase lock loop circuit utilized in a token ring network which utilizes a local oscillator to enhance frequency acquisition is disclosed in an article entitled "Architecture and Design of a Reliable Token Ring Network," by Werner Bux et al., appearing in the *IEEE Journal on Selected Areas in Communications*, November 1983, pp. 756-765. That article, as illustrated in FIG. 5, shows that either the data in (including an embedded clock signal) or a crystal oscillator local to the receiving circuit is utilized via multiplexer (MUX) to control a single loop filter. The disadvantages of this circuit relative to the phase lock loop circuit of the instant invention, which uses a pair of filters, will be discussed hereinafter.

SUMMARY OF INVENTION

Apparatus adapted for determining the frequency of a clock signal from a received data signal which includes the clock signal, comprises first and second servo loops. The first servo loop comprises first means for comparing the data signal and a signal representing a frequency of an output recovered clock frequency for producing an output signal having a parameter corresponding to the difference between the frequency of the included clock signal and output recovered clock frequency signal, and a parameter controlled oscillator responsive to the first means output signal for producing the output recovered clock frequency signal.

The second servo loop comprises a signal source having a frequency which is nominally proportional to the frequency of the clock signal, second means responsive to the signal source and to the output recovered clock frequency signal for producing an output signal corresponding to the difference in frequency between those of the two signals input to it, and third means responsive to the absence or presence of the received data signal and to the second means output signal for producing an output signal having a parameter corresponding to the second means output signal in the absence of the received data signal and, in the presence of the received data signal, to a value that the third means had during the absence of the received data signal. The parameter controlled oscillator is also responsive to the third means output signal for thereby more quickly producing an output signal corresponding to the included clock frequency of the data signal than in the absence of the second servo loop.

DETAILED DESCRIPTION

Figure 1:
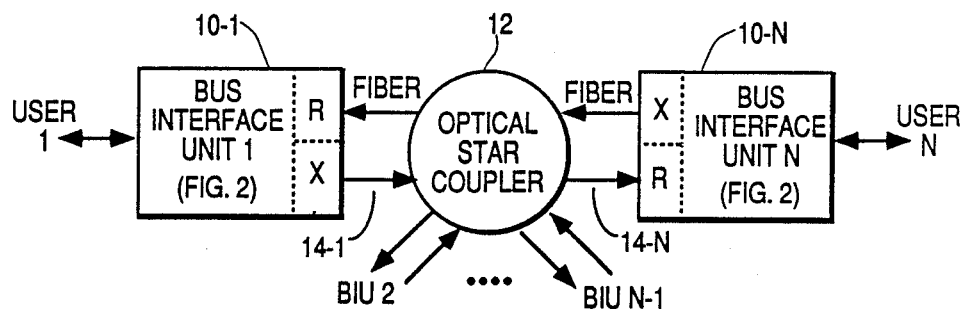
FIG. 1 illustrates a typical local area network including a plurality of bus interface units (BIU) which may incorporate the present invention.

Referring now to FIG. 1 which shows an exemplary fiber optic local area network, a plurality of users, user 1 and user N being shown, are connected via bus interface units (BIU) 10-1 and 10-N, respectively, (and others not shown) to an optical star coupler 12 by a bidirectional fiber optic connection generally labelled 14-1 and 14-N, respectively. Other BIU's may also typically be coupled to optical star coupler 12 as indicated by the legends BIU 2 and BIU N-1. The local area network shown in FIG. 1 is particularly suited to a token bus network in which messages are transmitted as bursts.

A typical bus interface unit includes a transmitter portion indicated as X in BIU 10 which converts electrical signals, received from the user, to optical signals for transmission over the fiber optic cables 14 from one user to coupler 12 then to all other connected users, and typically the sending user. BIU 10 also includes a receiving portion, indicated as R, which converts optical signals to electrical signals utilized by the remainder of the BIU and the user device attached thereto. An optical star coupler is a conventionally available device. One such optical star coupler is Model No. TCS64X64, manufactured by Canstar, 3900 Victoria Park Avenue, North York, Ontario, Canada.

Figure 2:
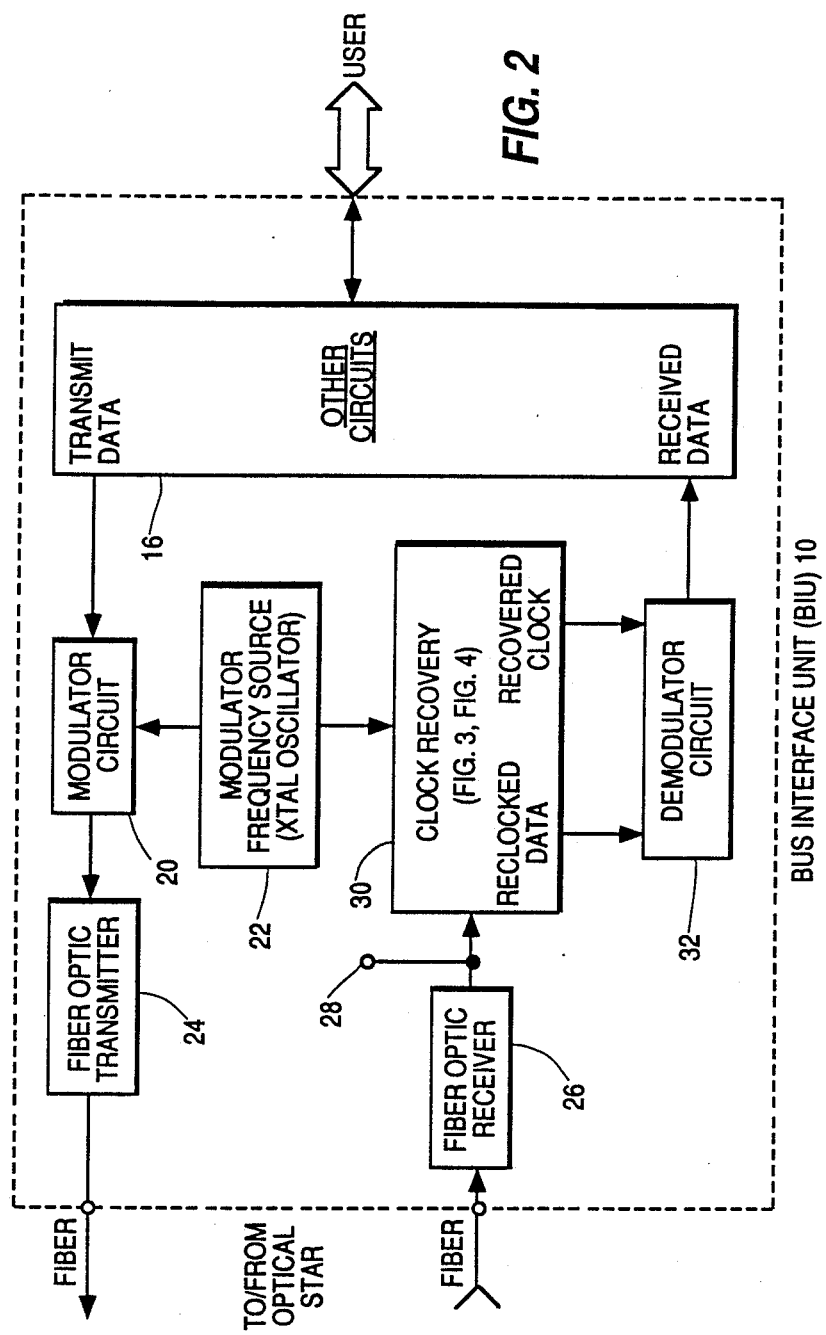
FIG. 2 illustrates in greater detail a typical bus interface unit of the type illustrated in FIG. 1.

An exemplary bus interface unit 10 is as illustrated in FIG. 2 to which attention is now directed. BIU 10 in FIG. 2 includes a section 16 for transmitting digital electrical data received from a typical user to a modulator circuit 20. Modulator circuit 20 also receives a signal from a modulator frequency source 22 such as a crystal oscillator. The oscillator frequency is the same in all BIU's, an exemplary frequency being 400 MHz. Typical modulation techniques for embedding the clock frequency signal into the data signal to produce a composite data signal are, by use of Manchester encoding, Miller (delay modulation), and 4B5B block coding. Of these, block coding is favored at very high frequencies due to the code's 0.8 efficiency ratio when a PLL can be used for clock recovery. The resulting data signal embedded with an appropriate clock signal is passed to fiber optic transmitter 24 (indicated as X in the BIU of FIG. 1) which converts the electrical signal to an optical digital signal for transmission over the fiber network to optical star 12 in FIG. 1 and then to other BIU units and typically, though not necessarily, back to the receiver portion of the particular BIU which transmitted the signal in the first place.

A signal transmitted through optical star coupler 12 to BIU 10 in FIG. 2 is received by the fiber optic receiver 26 section thereof (indicated as R in the BIU of FIG. 1) and is converted thereby from an optical signal into an electrical signal which contains both data and clock information (previously encoded at the transmitter using, typically, one of the aforementioned modulation schemes). The output from fiber optic receiver 26 at terminal 28 is coupled to a clock recovery unit 30. Clock recovery circuit 30 receives an input from the modulator frequency source 22 contained within BIU 10. The clock recovery unit 30 produces, at its outputs, reclocked data and the recovered output clock signal in a manner to be described hereinafter. The demodulator circuit 32 produces, at its output, a received data signal stripped of its clock signal component. At least the received data signal, but typically also the recovered clock signal, are passed to other circuits (block 16) then to the associated user.

Figure 3:
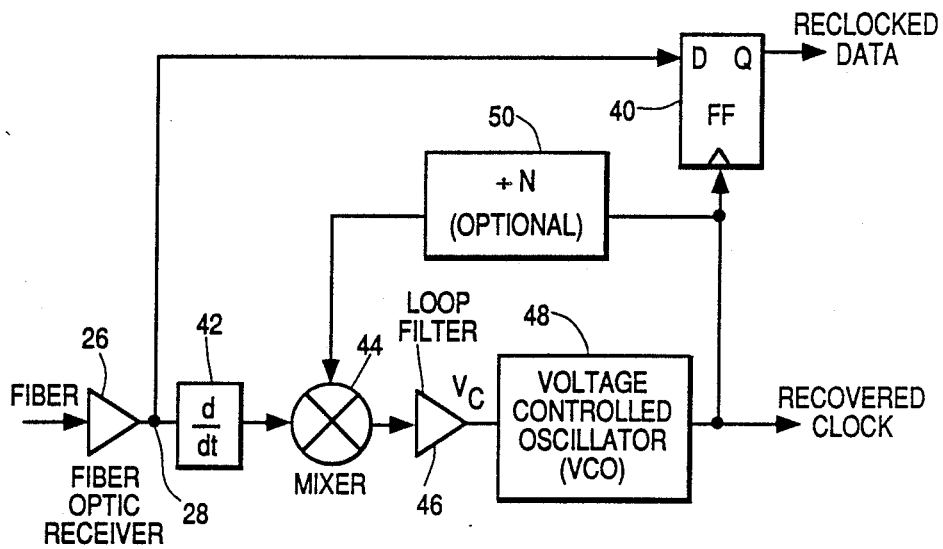
FIG. 3 is a typical prior art phase lock loop clock recovery circuit which could be utilized in the BIU of FIG. 2.

FIG. 3, to which attention is now directed, illustrates a prior art clock recovery circuit of the phase lock loop (PLL) type. The output of fiber optic receiver 26 (as illustrated in FIG. 2) at terminal 28 is coupled both to the D input of a D-type flip-flop 40 and to a differentiator circuit 42. The purpose of circuit 42, in general, is to enhance or make explicit the spectral output at the clock frequency of the combined data and clock signal produced by fiber optic receiver 26. The output of circuit 42 is coupled to one input of a mixer 44.

The output of mixer 44 is coupled to the input of a loop filter 46. Filter 46 is typically a lag-lead low pass circuit, the characteristics of which are derived from the closed loop PLL transfer function adjusted to satisfy the required PLL response to burst data inputs. The output of filter 46 is coupled to the control input of a voltage controlled oscillator (VCO) 48. VCO 48 produces at its output a recovered clock signal which is connected to the clock input of flip-flop 40 and optionally directly to a second input of mixer 44 or through a divide-by-N circuit 50 to the second input of mixer 44.

It is understood that the differentiator circuit 42, mixer circuit 44 and loop filter 46 could be replaced in part or whole, by similar device(s) for comparing the received data signal from the fiber optic receiver with the VCO clock signal for producing a signal having a parameter corresponding to the difference in frequency between the two signals applied to mixer 44.

One purpose of divide-by-N circuit 50 is to reduce the frequency if it is of such a high value that mixer 44 would be required to be of unnecessarily expensive design in the absence of the divide-by-N circuit 50. Alternatively, or in addition, the divide-by-N circuit 50 is used to satisfy a particular coding or modulation scheme's relationship of recovered (or demodulation) clock to the clock component embedded in the data. The Q output of flip-flop 40 is the reclocked data signal to be demodulated by circuit 32 and further processed by circuit 16 and sent to the user as illustrated in FIG. 2. All of the components illustrated in FIG. 3 and their interconnection are of conventional design and are well known to those skilled in the art of phase lock loop clock recovery design.

In the operation of FIG. 3, a data signal (including an embedded clock signal) in optical form, is received by fiber optic receiver 26 and converted thereby to an equivalent electrical digital signal at terminal 28. That digital signal is passed to circuit 42 which extracts or enhances the clock signal portion of the signal producing a signal having a frequency component corresponding to the clock signal frequency of source 22 (FIG. 2) which signal is passed to mixer 44. Also passed to mixer 44 is the output signal of VCO 48 which represents the present output frequency of VCO 48 which ideally corresponds to that of the clock frequency embedded in the data signal but which may be above or below that desired frequency.

In particular, when no data signal is being received by fiber optic receiver 26 the frequency of the output signal of VCO 48 is indeterminate (i.e. unlocked or free-running).

Mixer 44 produces at its output, which is input to loop filter 46, an error signal corresponding to the difference in frequency between the desired frequency, that is the clock frequency of the signal embedded in the data signal received at fiber optic receiver 26 when such signal is being received, and the actual frequency produced by VCO 48. Loop filter 46 "smooths" the error signal (by attenuating high frequency error components and out-of-band noise) and applies a corresponding error correction voltage, as required, to VCO 48 which then increases or decreases the frequency of its output signal to eliminate the frequency error and also corrects the phase of the VCO output to match that of the incoming clock signal.

Flip-flop 40 is clocked by the resulting output signal at the proper clock rate and produces desired data output signal at the Q output of flip-flop 40. When data is applied to fiber optic receiver 26, the PLL will eventually lock onto the clock frequency embedded in the data signal. Typical lock-on time is 8 microseconds for a clock signal of 400 MHz.

A problem occurs with the phase lock loop circuit of FIG. 3 where the incoming signal to fiber optic receiver 26 is a burst (non-continuous) signal. This is so because at first when the leading edge of the signal appears, there is typically a great error between the frequency produced by VCO 48 and the desired frequency as present in the incoming data signal. Depending on the loop gain and the parameters of loop filter 46, it may take a considerable amount of time for VCO 48 output to become stabilized at the proper frequency and phase. If loop filter 46 is designed such as to allow relatively rapid acquisition of the correct frequency, it is then susceptible in that the PLL can too easily shift frequency (and/or phase) in response to noise signals inherent in the signal appearing at the output of fiber optic receiver 26.

Figure 4:
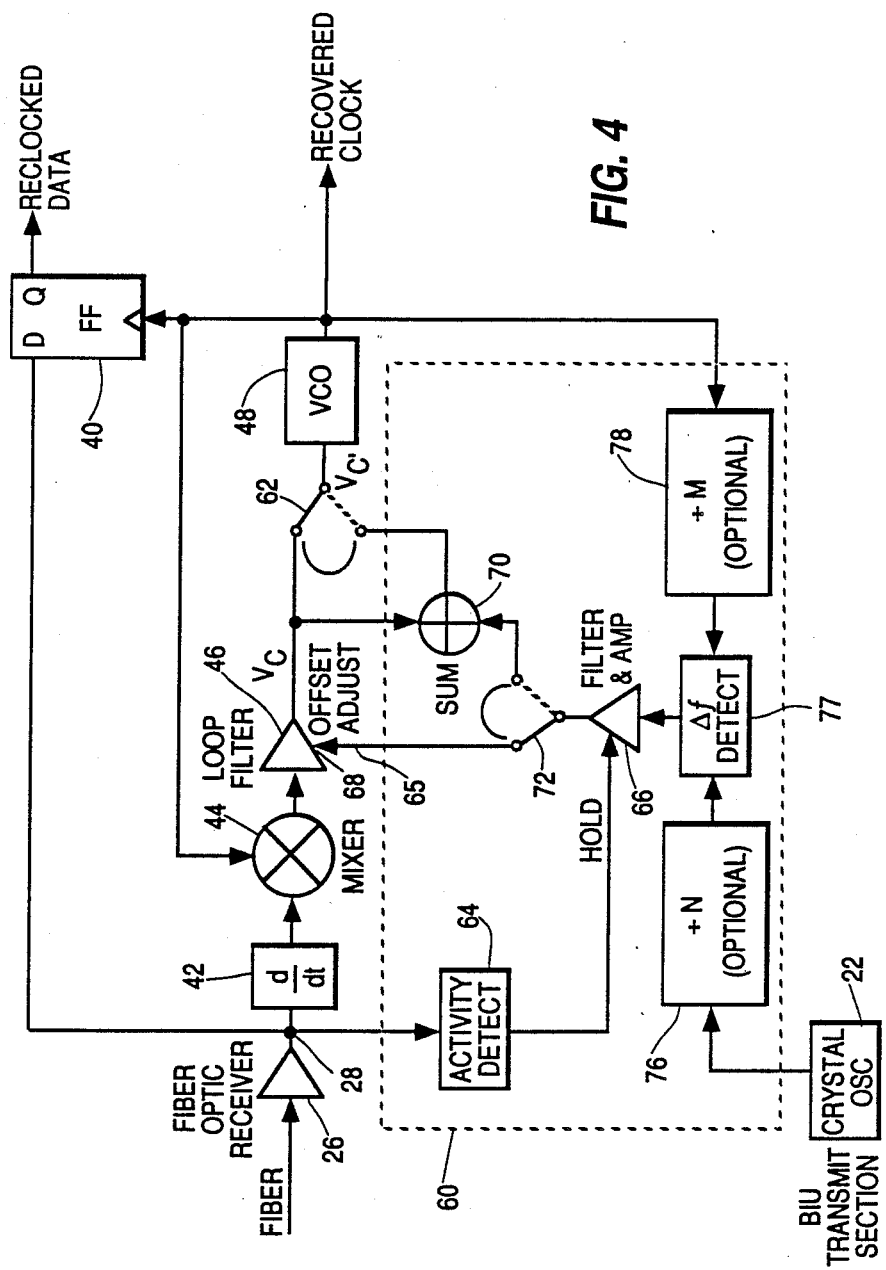
FIG. 4 is a dual phase lock loop circuit for clock recovery useful in the BIU of FIG. 2 in accordance with the teachings of the present invention.

An improved phase lock loop circuit with aided frequency acquisition solves the aforementioned problems of the FIG. 3 circuit and is illustrated in FIG. 4, to which attention is now directed.

In FIG. 4, all of the elements above dashed line 60 are as described in connection with FIG. 3 except for the addition of switch 62 and an offset input 65 to loop filter 46. (The elements within dashed block 60 form the aided frequency acquisition portion of the phase lock clock recovery circuit of FIG. 4.)

Terminal 28, in addition to being connected to flip-flop 40 and differential circuit 42, is also coupled to activity detector 64. Activity detector 64 produces at its output a signal indicative of whether a data signal is or is not being received at terminal 28. The output of activity detector 64 is coupled to a hold input of a filter and amplifier circuit 66. The filter parameters of circuit 66 are selected independent of the parameters of loop filter 46 as determined by the second frequency control loop's transfer function and design requirements. The output of filter and amplifier circuit 66 is coupled optionally to the offset adjust input 68 of loop filter 46 or to one input of a summing circuit 70 via single pole-double throw (SP-DT) switch 72. It should be understood that switch 72 and SP-DT switch 62 are merely schematic in nature; either the output of circuit 66 is connected to the loop filter 46 or connected to the summing circuit 70. It is not switched between those two circuit elements. The output $V_c$ of loop filter 46 is connected to a second input of summing circuit 70, if the summing circuit option is used. The output of summing circuit 70 is connected via switch 62 to the input of VCO 48. Again, it is to be understood that switches 62 and 72 are not actually present. What is illustrated is two alternative connection methods using either an offset adjust or a summing circuit 70.

The output of crystal oscillator 22, which is the same crystal oscillator as illustrated in FIG. 2, is coupled to $\Delta f$ detector 74 either directly or optionally via divide-by-N circuit 76, while the output of VCO 48 is coupled to a second input of $\Delta f$ detector 74 either directly or optionally via divide-by-M circuit 78. Detector 74 produces at its output a digital signal equal to or representing the difference in frequency of the two signals applied to it. The output of $\Delta f$ detector 7 is coupled to the filter input of filter and amplifier circuit 66. The main purpose of divide-by-N circuit 76 and divide-by-M circuit 78 is to reduce the frequency as produced by crystal oscillator 22 and as produced by the output of VCO 48, respectively, to allow less expensive and more readily available components for $\Delta f$ detector 74 and filter and amplifier 66. A second reason for the divide-by-N (M) circuit is to provide design versatility in the determination of the loop gain and filter 66 parameters.

For a system with a clock frequency of 400 MHz a typical value of N and M is 50.

Operation of the circuit of FIG. 4 is as follows. With no data signal input to fiber optic receiver 26, absence of such a signal via activity detector 64 removes the hold from filter and amplifier 66. The output from crystal oscillator 22 (In all BIU transmit sections of all BIU units 10, FIG. 2, the crystal oscillators are nominally identical in frequency.) or the signal divided in frequency by N is applied to Δf detector 74. Δf detector 74 is typically a digital type circuit producing a digital output signal which is a function of the difference in frequency of crystal oscillator 22 and the output of VCO 48 scaled as appropriate by divide-by-N counter 76 and divide-by-M counter 78.

When no activity is detected by activity detector 64, filter and amplifier 66 are activated to produce a frequency difference signal which is applied either to the offset adjust input of loop filter 46 or is applied to summing circuit 70 depending on the setting of switch 72.

If the signal is applied to offset adjust terminal 68, the output of loop filter 46, a voltage $V_c$, corresponds in amplitude to the frequency difference between the output of VCO 48 and crystal oscillator 22 and that signal, also legended $V_c'$, is applied to VCO 48 (through switch 62) to cause the output thereof to be identical to the frequency of crystal oscillator 22 or at least scaled to be some known multiple greater or lesser than one thereof. If the signal is applied to summing circuit 70, the signal is summed in summer 70 with the output $V_c$ of loop filter 46 to produce voltage $V_c'$ which is applied to VCO 48. During periods of no signal input to node 28, there is no output from mixer 44 and in the case of the presence of a summing circuit 70, no output from loop filter 46.

When a burst signal is received at terminal 28, activity detector 64 detects the same and holds filter and amplifier 66 at a given output, typically that which it had just before the leading edge of the burst signal occurred. At that time, however, VCO 48 is producing either exactly the correct clock frequency of the signal input to terminal 28 or a frequency very close to that frequency, in which case only a very minor correction need be made to the phase lock loop comprising elements 42, 44, 46 and 48. It will be understood that either the held output of signal from filter and amplifier circuit 66 is coupled as an offset adjust to loop filter 46 or the output of held filter and amplifier 66 circuit is summed with the output signal from loop filter 46 to provide the desired voltage $V_c'$ to VCO 48. Desired voltage $V_c'$ results in the desired frequency and phase of the recovered clock signal from VCO 48, that is the frequency and phase of the clock embedded in the data signal received at terminal 28.

Thus, the purpose of the "VCO frequency control loop" associated with Δf detector 74 and filter and amplifier 66 is to drive the VCO 48 control input to such a value $V_c'$ (accomplished during periods of no activity) that only an extremely small loop filter 46 output signal value is necessary to frequency and phase lock the FIG. 4 circuit to the incoming burst data stream's embedded clock information. As a result, the required acquisition time is minimized for burst inputs. Reliable clocking of data through flip-flop 40 is then accomplished as described in connection with FIG. 3.

The Bux et al. article, as earlier mentioned, utilizes a local clock oscillator to speed up clock acquisition from the remote data signal as does the instant invention. But Bux et al., unlike the instant invention, uses only one loop filter and is essentially a single loop design. This has the disadvantage that the characteristics of the loop filter and the loop gain (loop transfer function) must be compromised to achieve the dual design goals of long term frequency centering or control in concert with the rapid "lock-on" requirement of the same for the input data. Thus, Bux et al. has the disadvantage relative to the instant invention that two independent loops do not exist so as to optimize each for their particular requisite functions. Also, in Bux et al., the phase and frequency detectors must produce the same (compatible) outputs so as to be properly input to the multiplex circuit. This restriction does not apply to the instant invention.

It will be understood that although the invention has been described in connection with the local area network involving fiber optics, the inventive phase lock loop is not limited to use in a fiber optic network nor is it limited to use in a system involving fiber optics or a local area network at all.

What is claimed is:

1. Apparatus adapted for determining the frequency of a clock signal from a received data signal which includes said clock signal, comprising in combination:
   first and second servo loops;
   said first servo loop comprising in combination:
   first means for comparing said data signal and a signal representing a frequency of an output recovered clock frequency for producing an output signal having a parameter corresponding to the difference between the frequency of said included clock signal and output recovered clock frequency signal; and
   a parameter controlled oscillator responsive to said first means output signal for producing said output recovered clock frequency signal;
   said second servo loop comprising in combination:
   a signal source having a frequency which is nominally proportional to said frequency of said clock signal;
   second means responsive to said signal source and to said output recovered clock frequency signal for producing an output signal corresponding to the difference in frequency between those of the too signals input to it; and
   third means responsive to the absence or presence of said received data signal and to said second means output signal for producing an output signal having a parameter corresponding to said second means output signal in the absence of said received data signal and, in the presence of said received data signal, to a value that said third means had during the absence of said received data signal;
   said parameter controlled oscillator also being responsive to said third means output signal for thereby more quickly producing an output signal corresponding to the included clock frequency of said data signal than in the absence of said second servo loop.

2. The combination of claim 1 wherein said first means comprises fourth means responsive to said data signal, when present, for producing an output signal representing said clock signal, fifth means for mixing said output signal and said signal representing said frequency of said output recovered clock frequency to produce an output signal which is the difference of the two signals input to it and filter sixth means responsive to said fifth means output signal for producing said output signal having a parameter corresponding to said difference frequency.

3. The combination as set forth in claim 1 wherein said first and second servo loops are each phase lock loops.

4. The combination as set forth in claim 1 wherein said parameter controlled oscillator comprises a voltage controlled oscillator.

5. The combination as set forth in claim 1 wherein said signal source having a frequency comprises a crystal oscillator.

6. The combination as set forth in claim 1 wherein said second means comprises means producing a digital signal, the value of which corresponds to said difference in frequency.

7. The combination as set forth in claim 1 wherein said third means comprises an activity detector for producing an output signal having binary values corresponding to the presence or absence of said received data signal and means responsive to said activity detector output signal and second means output signal for producing said output signal having said parameter.

8. Apparatus adapted for determining the frequency of a clock signal from a received data signal which includes said clock signal, comprising in combination:
   first and second phase lock loops;
   said first phase lock loop comprising in combination:
   first means responsive to said data signal, when present, for producing an output signal representing said clock signal, second means for mixing said output signal and a signal representing a frequency of an output recovered clock frequency to produce an output signal which is the difference of the two signals input to it and filter third means responsive to said second means output signal for producing an output signal having a parameter corresponding to the difference between the frequency of said included clock signal and output recovered clock frequency signal; and
   a voltage controlled oscillator responsive to said third means output signal for producing said output recovered clock frequency signal;
   said second phase lock loop comprising in combination:
   a signal source having a frequency which is nominally proportional to said frequency of said clock signal;
   fourth means responsive to said signal source and to said output recovered clock frequency signal for producing an output signal corresponding to the difference in frequency between those of the two signals input to it; and
   fifth means responsive to the absence or presence of said received data signal and to said fourth means output signal for producing an output signal having a parameter corresponding to said fourth means output signal in the absence of said received data signal and, in the presence of said received data signal, to a value that said fifth means had during the absence of said received data signal;
   said voltage controlled oscillator also being responsive to said third means output signal for thereby more quickly producing an output signal corresponding to the included clock frequency of said data signal than in the absence of said second phase lock loop.

9. The combination as set forth in claim 8 wherein said signal source having a frequency comprises a crystal oscillator.

10. The combination as set forth in claim 8 wherein said fourth means comprises means producing a digital signal, the value of which corresponds to said difference in frequency.

11. The combination as set forth in claim 8 wherein said fifth means comprises an activity detector for producing an output signal having binary values corresponding to the presence or absence of said received data signal and means responsive to said activity detector output signal and fourth means output signal for producing said output signal having said parameter.

* * * * *